(12) United States Patent
Lu et al.

(10) Patent No.: US 12,212,327 B2
(45) Date of Patent: Jan. 28, 2025

(54) PHASE-LOCKED LOOPS (PLL), INCLUDING TIME-TO-DIGITAL CONVERTER (TDC) GAIN CALIBRATION CIRCUITS AND RELATED METHODS

(71) Applicant: Microsoft Technology Licensing, LLC, Redmond, WA (US)

(72) Inventors: Ping Lu, Cary, NC (US); Bupesh Pandita, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/114,847

(22) Filed: Feb. 27, 2023

(65) Prior Publication Data

US 2024/0291495 A1   Aug. 29, 2024

(51) Int. Cl.
*H03L 7/085* (2006.01)
*G04F 10/00* (2006.01)
(Continued)

(52) U.S. Cl.
CPC ............ *H03L 7/107* (2013.01); *G04F 10/005* (2013.01); *H03L 7/085* (2013.01); *H03L 7/093* (2013.01); *H03L 7/099* (2013.01); *H03L 7/1077* (2013.01)

(58) Field of Classification Search
CPC ......... H03L 7/085; H03L 7/093; H03L 7/107; H03L 7/1077; G04F 10/005
See application file for complete search history.

(56) References Cited

U.S. PATENT DOCUMENTS 6,026,501 A   2/2000 Hohl et al.
10,680,622 B2 *   6/2020 Monk .................. H03L 7/085
(Continued)

FOREIGN PATENT DOCUMENTS

GB   2380831 A   4/2003
GB   2487575 A   8/2012

OTHER PUBLICATIONS

Ebuchi, et al., "A 125-1250 MHz process-independent adaptive bandwidth spread spectrum clock generator with digital controlled self-calibration," IEEE Journal of Solid-State Circuits, vol. 44, Issue No. 3, Mar. 1, 2009, pp. 763-774.
(Continued)

*Primary Examiner* — Patrick O Neill
(74) *Attorney, Agent, or Firm* — Withrow & Terranova, PLLC

(57) ABSTRACT

In a calibrated phase-locked loop (PLL), a time-to-digital (TDC) converter circuit can be calibrated to a nominal gain by a calibration circuit to achieve a desired jitter response in the PLL. The TDC circuit in the PLL measures a time difference between the reference clock and a feedback signal as a number of time increments, and the calibration circuit adjusts a resolution of the measurement by adjusting the length of the time increments (i.e., resolution). In a Vernier method employed to measure the time difference, the length of a time increment is determined by a delay difference between a first delay of a first delay circuit in a first series of first delay circuits and a second delay of a second delay circuit in a second series of second delay circuits. Adjusting the resolution of the TDC circuit includes adjusting the delay difference between the first delay and the second delay.

23 Claims, 5 Drawing Sheets

(51) Int. Cl.
*H03L 7/093* (2006.01)
*H03L 7/099* (2006.01)
*H03L 7/107* (2006.01)

(56) References Cited

U.S. PATENT DOCUMENTS

| | | | |
|---|---|---|---|
| 11,646,743 B1* | 5/2023 | Sabharwal | H03L 7/095 |
| | | | 327/156 |
| 2019/0052278 A1* | 2/2019 | Pandita | H03L 7/18 |
| 2023/0384738 A1* | 11/2023 | Lu | H03L 7/103 |
| 2024/0267052 A1 | 8/2024 | Lu | |

OTHER PUBLICATIONS

Kim, et al., "Self-calibrated digital two-point modulator for BLE RF transmitter," IEEE Transaction on Circuits and Systems II: Express Briefs, vol. 69, Issue No. 12, Jun. 20, 2022, pp. 4739-4743.

Marzin, et al., "A 20 Mb/s Phase Modulator Based on a 3.6. GHz Digital PLL With 36 dB EVM at 5 mW Power," IEEE Journal of Solid-State Circuits, vol. 47, Issue No. 12, Dec. 1, 2012, pp. 2974-2988.

International Search Report and Written Opinion received for PCT Application No. PCT/US2024/013530, Jun. 24, 2024, 14 pages.

International Search Report and Written Opinion received for PCT Application No. PCT/US2024/015420, Jul. 17, 2024, 13 pages.

\* cited by examiner

PHASE-LOCKED LOOPS (PLL), INCLUDING TIME-TO-DIGITAL CONVERTER (TDC) GAIN CALIBRATION CIRCUITS AND RELATED METHODS

FIELD OF THE DISCLOSURE

The technology of the disclosure relates, in general, to phase-locked loops (PLL) and, more particularly, to jitter response in PLLs.

BACKGROUND

Integrated circuits (ICs) can include multiple clock domains that communicate with each other, with each clock domain being a group of digital logic circuits that are synchronized to the same clock. Communications between different clock domains rely on synchronization of the clocks of those clock domains. Each clock domain may have a dedicated phase-locked loop (PLL) for providing a clock to the circuits within the clock domain. A PLL includes a digitally controlled oscillator (DCO) that generates an output clock synchronized to a reference clock by a feedback circuit and a time-to-digital converter (TDC). The feedback circuit detects a time difference between the reference clock and the output clock, and the TDC converts that time difference to a digital control value that is used to adjust the output clock generated in the DCO to reduce the time difference. There is a time difference between the feedback signal and the reference clock when a PLL is initially powered on, but the time difference is gradually reduced until the PLL is in a lock (i.e., synchronized) state. Each clock domain generates an output clock based on the same reference clock. Variations in that reference clock, such as jitter, cause a time difference from the output clock, which disturbs the PLL output clock edges. How PLLs in the respective clock domains respond to the reference clock jitter can vary depending on the loop bandwidth of the PLL, which is based on the gains of components of the PLL, such as the TDC and DCO. If the PLLs in different clock domains of an IC receive the same reference clock but respond differently to jitter in the reference clock because they have different loop bandwidths, the jitter can cause timing problems that reduce performance or cause communication failures.

SUMMARY

Exemplary aspects disclosed herein include phase-locked loops (PLLs) that include time-to-digital converter (TDC) gain calibration circuits. Related methods of TDC gain calibration are also disclosed. Performance of interfaces between clock domains in an integrated circuit (IC) suffers when the clocks of the respective clock domains are poorly synchronized. Synchronization can degrade when the PLLs in respective clock domains respond differently to jitter in a reference clock received by each of the PLLs. PLL response to reference clock jitter depends on a loop bandwidth of the PLL, which is determined by the gains of components of the PLL, and those gains can vary due to manufacturing conditions and the PLL circuit environment. In an exemplary calibrated PLL, a TDC circuit in a PLL can be calibrated to a nominal gain by a calibration circuit to achieve a desired jitter response. The calibrated PLL in each clock domain of an IC can be calibrated to have the same desired jitter response to optimize clock domain synchronization. The TDC circuit in the PLL measures a time difference between the reference clock and a feedback signal as a number of time increments, and adjusting the gain of the TDC circuit includes adjusting the length of the time increments (resolution) used in the measurement of the time difference. For example, in a Vernier method for measuring the time difference, the length of a time increment is determined by a delay difference between a first delay in each first delay circuit in a first series of first delay circuits and a second delay in each second delay circuit in a second series of second delay circuits. Therefore, adjusting the resolution of the TDC circuit means adjusting the delay difference between the first delay and the second delay.

In one exemplary aspect, a calibrated phase-locked loop (PLL) comprising a PLL is disclosed. The PLL comprises a phase-frequency detector (PFD) circuit configured to receive a reference signal and a feedback signal and generate a start signal and a stop signal separated in time by a time difference between the reference signal and the feedback signal. The PLL comprises a time-to-digital converter (TDC) circuit configured to generate a digital control value indicating the time difference, the digital control value having a resolution. The PLL comprises a digitally controlled oscillator (DCO) circuit configured to generate an output clock based on a digital control value. The PLL also comprises a divider circuit configured to generate a feedback clock based on the output clock. The calibrated PLL further comprises a calibration circuit configured to receive a reference clock and generate the reference signal and the feedback signal based on the reference clock, the feedback clock, and the output clock. The calibration circuit is also configured to generate a resolution control signal to control a resolution of the TDC circuit.

In another exemplary aspect, a method in a calibrated PLL is disclosed. The method 200 comprises receiving a reference signal and a feedback signal and generating a start signal and a stop signal separated in time by a time difference between the reference signal and the feedback signal. The method comprises generating, in a time-to-digital converter (TDC) circuit, a digital control value indicating the time difference, the digital control value having a resolution, and generating an output clock based on the digital control value. The method includes receiving a reference clock, generating the reference signal and the feedback signal based on the reference clock, the feedback clock, and the output clock, and generating a resolution control signal to control a resolution of the TDC circuit.

In another exemplary aspect, an IC comprises digital logic circuits disposed in a plurality of clock domains. Each clock domain comprises a calibrated phase-locked loop (PLL). The calibrated PLL comprises a PLL comprising a phase-frequency detector (PFD) circuit configured to receive a reference signal and a feedback signal and generate a start signal and a stop signal separated in time by a time difference between the reference signal and the feedback signal. The PLL comprises a time-to-digital converter (TDC) circuit configured to generate a digital control value indicating the time difference and a digitally controlled oscillator (DCO) circuit configured to generate an output clock based on the digital control value. The PLL also comprises a divider circuit configured to generate a feedback clock based on the output clock. The calibrated PLL further comprises a calibration circuit 104 configured to receive a reference clock and generate the reference signal and the feedback signal based on the reference clock, the feedback clock, and the output clock. The calibration circuit is also configured to generate a resolution control signal to control a resolution of the digital control value generated in the TDC circuit.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 4A:
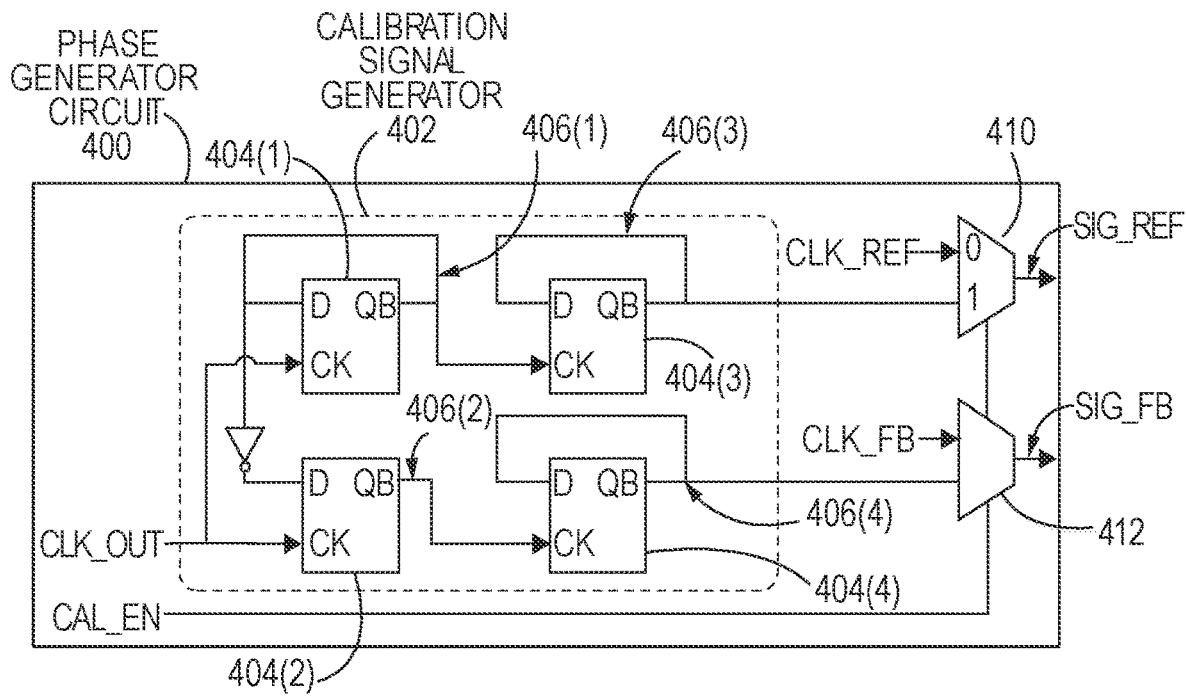
FIG. 4A is a schematic diagram of a phase generator circuit employed to generate calibration signals for the calibration circuit to calibrate the resolution of a TDC in the PLL in FIG. 1.
Figure 4B:
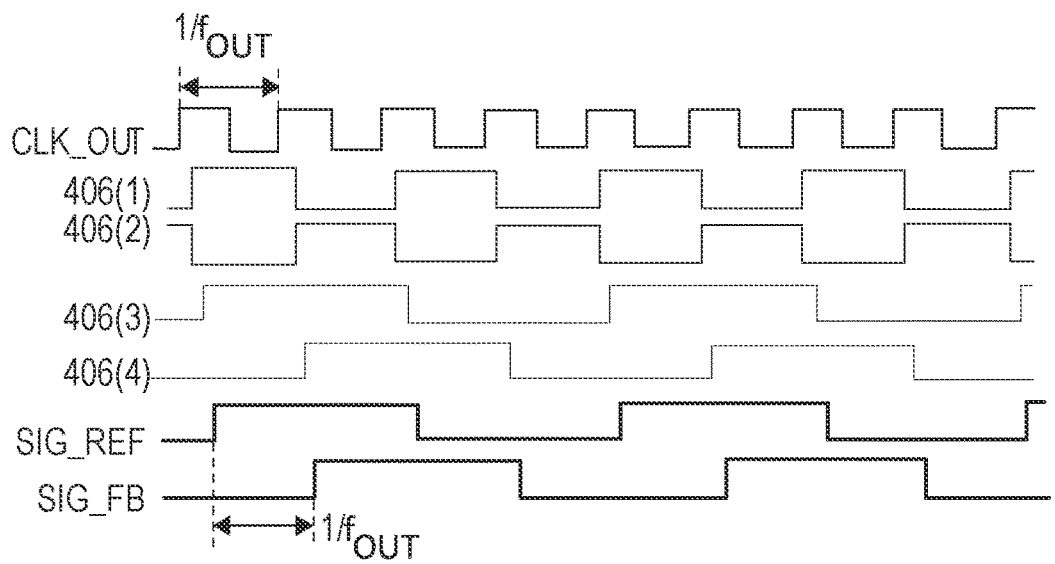
Figure 5:
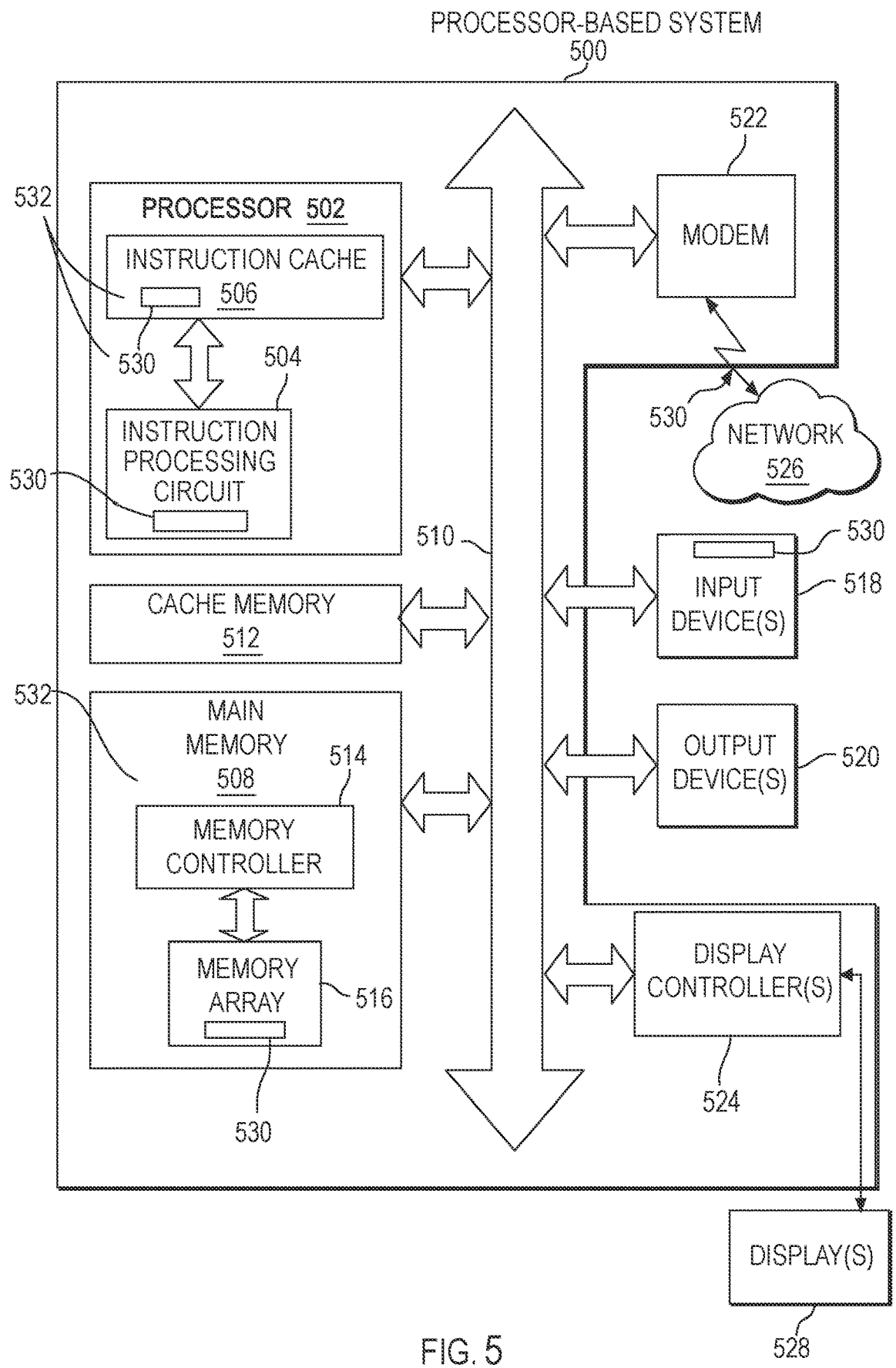

FIG. 4B is a timing diagram illustrating operation of the calibration signal generator in FIG. 4A for generating a reference signal and a feedback signal at a calibration frequency and separated in time by a calibration time difference; and FIG. 5 is a block diagram of an exemplary processor-based system including a plurality of devices coupled together through a system bus, wherein the processor-based system comprises at least one integrated circuit (IC) that includes multiple clock domains, each with a calibrated PLL that includes a PLL and a calibration circuit to adjust a gain of a TDC to a nominal gain, to normalize jitter response across the IC.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include phase-locked loops (PLLs) that include time-to-digital converter (TDC) gain calibration circuits. Related methods of TDC gain calibration are also disclosed. Performance of interfaces between clock domains in an integrated circuit (IC) suffers when the clocks of the respective clock domains are poorly synchronized. Synchronization can degrade when the PLLs in respective clock domains respond differently to jitter in a reference clock received by each of the PLLs. PLL response to reference clock jitter depends on a loop bandwidth of the PLL, which is determined by the gains of components of the PLL, and those gains can vary due to manufacturing conditions and the PLL circuit environment. In an exemplary calibrated PLL, a TDC circuit in a PLL can be calibrated to a nominal gain by a calibration circuit to achieve a desired jitter response. The calibrated PLL in each clock domain of an IC can be calibrated to have the same desired jitter response to optimize clock domain synchronization. The TDC circuit in the PLL measures a time difference between the reference clock and a feedback signal as a number of time increments, and adjusting the gain of the TDC circuit includes adjusting the length of the time increments (resolution) used in the measurement of the time difference. For example, in a Vernier method for measuring the time difference, the length of a time increment is determined by a delay difference between a first delay in each first delay circuit in a first series of first delay circuits and a second delay in each second delay circuit in a second series of second delay circuits. Therefore, adjusting the resolution of the TDC circuit means adjusting the delay difference between the first delay and the second delay.

Figure 1:
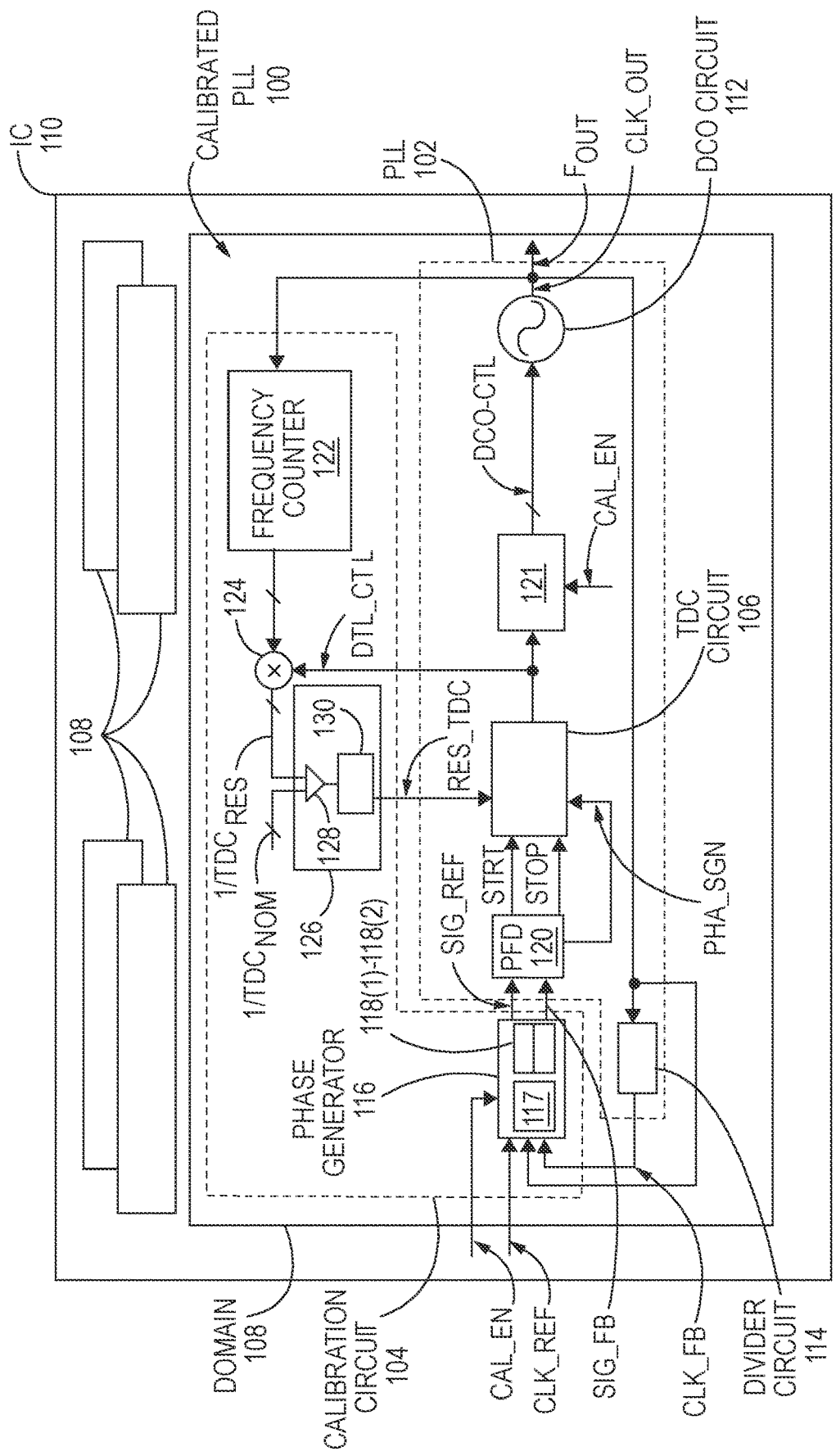
FIG. 1 is a block diagram of an exemplary calibrated phase-locked-loop (PLL), including a PLL circuit and a calibration circuit for calibrating a gain of a time-to-digital (TDC) circuit.

FIG. 1 is a block diagram of an exemplary calibrated phase-locked-loop (PLL) 100, including a PLL 102 and a calibration circuit 104 for adjusting a resolution of a time-to-digital (TDC) circuit 106 that corresponds to a nominal resolution $TDC_{NOM}$ in the PLL 102. The calibrated PLL 100 is disposed in one of a plurality of clock domains 108, each comprising digital logic circuits on an integrated circuit (IC) 110. One of the calibrated PLLs 100 in each clock domain 108 provides an output clock to the digital logic circuits of the corresponding clock domain. Adjusting the calibrated PLL 100 to the nominal resolution $TDC_{NOM}$ in each of the clock domains provides a normalized gain in each of the TDC circuits 106 to improve synchronization of communications between the clock domains in the event of jitter in a reference clock. Thus, the calibrated PLLs 100 may first be operated in a calibration mode to determine an adjustment (described below) to the TDC circuit 106 and are thereafter operated in a normal mode while provided the adjustment.

The PLL 102 includes a digitally controlled oscillator (DCO) circuit 112 that, in the normal mode, generates the output clock CLK_OUT based on a DCO control signal DCO_CTL. The PLL 102 also includes a divider circuit 114 that receives the output clock CLK_OUT and generates a feedback clock CLK_FB. A frequency $F_{OUT}$ of the output clock CLK_OUT may be based on a multiple (N) of a frequency $F_{REF}$ of a reference clock CLK_REF. The reference clock CLK_REF is provided to the calibrated PLL 100 by an external source, such as a crystal oscillator, and may also be provided to the other calibrated PLLs 100 disposed on the IC 110. The divider circuit 114 divides the output clock CLK_OUT by the multiple (N) to provide the feedback clock CLK_FB having the same, or approximately the same, frequency as the reference clock CLK_REF.

The calibration circuit 104 includes a phase generator 116, which includes a calibration signal generator 117, as explained in more detail below, and multiplexors 118(1) and 118(2). The calibration circuit 104 receives the output clock CLK_OUT from the DCO circuit 112, receives the reference clock CLK_REF from the external source, and receives the feedback clock CLK_FB from the divider circuit 114. The calibration circuit 104 generates a reference signal SIG_REF and a feedback signal SIG_FB. The calibration circuit 104 also receives a calibration enable signal CAL_EN that, in a first state, indicates that the calibrated PLL 100 is in the normal operation mode and, in a second state, indicates that the calibrated PLL 100 is in the calibration mode. In this regard, a "state" of the calibration enable signal CAL_EN may be indicated as a voltage state interpreted as either a binary "0" or "1", for example.

Within the phase generator 116, the calibration enable signal CAL_EN controls the multiplexors 118(1) and 118(2) to provide the reference clock CLK_REF as the reference signal SIG_REF and provide the feedback clock CLK_FB as the feedback signal SIG_FB to the PLL 102 in the normal operation mode of the calibrated PLL 100. The output clock CLK_OUT is not used in the phase generator 116 in the normal operation mode. In the calibration mode, as described in more detail below with reference to FIG. 4, calibration enable signal CAL_EN controls the multiplexors 118(1) and 118(2) to provide signals generated in the phase generator 116 as the reference signal SIG_REF and the feedback signal SIG_FB for calibrating the TDC circuit 106.

The PLL 102 includes a phase-frequency detector circuit ("PFD") 120 that receives the reference signal SIG_REF and the feedback signal SIG_FB from the phase generator 116. The PFD 120 generates a start signal STRT and a stop signal STOP that are separated in time by a time difference between the reference signal SIG_REF and the feedback signal SIG_FB. The reference signal SIG_REF and the feedback signal SIG_FB are oscillating signals, and the time difference may be identified, in the case of square wave oscillating signals, as a difference in time between a rising edge (e.g., a voltage step) of the reference signal SIG_REF and a rising edge of the feedback signal SIG_FB, for example. In a lock state of the PLL 102 during operation mode, a feedback frequency $F_{FB}$ of the feedback signal SIG_FB is the same as a reference frequency $F_{REF}$ of the reference clock CLK_REF. Also, in the lock state, the feedback signal SIG_FB is synchronized in time with the reference signal SIG_REF. For example, a rising edge of the feedback signal SIG_FB (e.g., indicated by a rise in voltage) is synchronized in time with a rising edge of the reference signal SIG_REF, which may mean that the time difference is zero or so small as to be undetectable. A time difference between a rising edge of the reference signal SIG_REF and a rising edge of the feedback signal SIG_FB may be positive or negative, meaning that a phase of the feedback signal SIG_FB may be leading or lagging a phase of the reference signal SIG_REF. A signal indicating whether the time difference is positive or negative is provided as a phase_sign signal PHA_SGN, which is generated by the PFD 120 and received by the TDC circuit 106. The PFD 120 detects such a time difference and generates the start signal STRT followed by the stop signal STOP with a separation in time equal to the absolute value of the time difference. For example, a rising edge of the stop signal STOP may follow a rising edge of the start signal STRT by the time difference detected between the reference signal SIG_REF and the feedback signal SIG_FB.

The start signal STRT and the stop signal STOP are provided to the TDC circuit 106. As the name ("time-to-digital converter") implies, the purpose of the TDC circuit 106 is to convert the time difference between the start signal STRT and the stop signal STOP to a digital control value DTL_CTL. In other words, the TDC circuit 106 provides a measure of the time difference as a number of time increments. The PLL 102 also includes a digital loop filter (DLF) 121 that, in the normal operation mode, receives the digital control value DTL_CTL from the TDC circuit 106, filters the digital control value DTL_CTL to reduce noise, and generates the DCO control signal DCO_CTL to control the DCO circuit 112. In the calibration mode, the DLF 121 provides the DCO control signal DCO_CTL to the DCO circuit 112 at a fixed calibration value, as explained below.

The digital control value DTL_CTL is a binary value representing the time difference as a number of time increments. A number of bits in the digital control value DTL_CTL and a resolution (of the time increments) of the digital control value DTL_CTL determine a maximum measurable time and a finest precision that can be indicated by the digital control value DTL_CTL. That is, each incremental change in the digital control value DTL_CTL represents a period of time or time increment that determines the finest precision of the digital control value DTL_CTL. This period of time is also referred to herein as the resolution of the TDC circuit 106 and may also be referred to as granularity. The maximum time that can be indicated by the digital control value DTL_CTL is the product of the time increment and the highest digital value that can be expressed by the digital control value DTL_CTL based on the number of bits thereof. For example, a three-digit number has $2^3=8$ possible values, so if each time incremental represents one (1) second, a maximum measurable time difference that the digital control value DTL_CTL can indicate is eight (8) seconds and the finest precision with which the digital control value DTL_CTL can accurately indicate a time difference is one (1) second.

Increasing a number of bits in the digital control value DTL_CTL requires an increase in circuits, which occupies more area and consumes more power in an IC. Therefore, there is a motivation to minimize the number of bits. However, there is also a desire to have fine precision (resolution) because the precision determines how small a difference can be detected between the feedback signal SIG_FB and the reference signal SIG_REF, which determines how closely the feedback signal SIG_FB can be synchronized to the reference signal SIG_REF. The resolution determines a gain of the TDC circuit 106. Thus, it is important for the TDC circuit 106 in each of the PLLs 102 on the IC 110 to be adjusted to a same desired resolution to achieve a common jitter response. In this regard, the calibration circuit 104 generates a resolution control signal RES_TDC to control a resolution of the digital control value DTL_CTL generated in the TDC circuit 106.

In the normal operation mode, as indicated by the calibration enable signal CAL_EN in a first state, the TDC circuit 106 constantly receives a resolution control signal RES_TDC provided by the calibration circuit 104 to adjust the resolution to a desired nominal resolution. The resolution control signal RES_TDC is determined during the calibration mode. It should be recognized that the resolution control signal RES_TDC may be different in each PLL 102 in the IC 110 due to variations in the circuits of the TDC circuit 106. In each case, the resolution control signal RES_TDC causes the TDC circuit 106 to have the desired nominal resolution. The reciprocal of the desired nominal resolution ($1/TDC_{NOM}$) is provided to the calibration circuit 104 during the calibration mode and may be provided from an external source and/or may be a programmable setting stored on the IC 110, for example.

The calibration circuit 104 includes a frequency counter circuit 122 and a multiplier circuit 124. The frequency counter circuit 122 receives the output clock CLK_OUT generated by the DCO circuit 112 and also receives the reference clock CLK_REF. The frequency counter circuit 122 determines an output clock frequency $F_{OUT}$. Determining the output clock frequency $F_{OUT}$ in this example includes counting a number of cycles of the output clock CLK_OUT that occur during a number of cycles of the reference clock CLK_REF. In this manner, the output clock frequency $F_{OUT}$ can be determined relative to the known reference clock frequency $F_{REF}$. In the calibration mode, the output clock frequency $F_{OUT}$ is a calibration frequency based on the fixed calibration value of the DCO control signal DCO_CTL to the DCO circuit 112.

The multiplier circuit 124 in the calibration circuit 104 multiplies the output clock frequency $F_{OUT}$ of the output clock CLK_OUT by the digital control value DTL_CTL to generate a resolution indicator $TDC_{RES}$ of the TDC circuit 106. The resolution indicator $TDC_{RES}$ generated in the multiplier circuit 124 indicates a number of time increments in the time difference between the reference signal SIG_REF and the feedback signal SIG_FB. In the calibration mode, the calibration enable signal CAL_EN controls the multiplexors 118(1) and 118(2) to provide signals generated in the phase generator 116 as the reference signal SIG_REF and the feedback signal SIG_FB. As described below, the reference signal SIG_REF and the feedback signal SIG_FB produced by the phase generator 116 have a constant calibration phase difference and a constant calibration frequency based on the output clock frequency $F_{OUT}$. As noted, in the calibration mode, the DLF 121 provides a fixed DCO control signal DCO_CTL to control the DCO circuit 112 to generate the output clock CLK_OUT at the constant calibration frequency.

In other words, in the calibration mode, the PLL 102 is run in an open-loop fashion in which the DCO control signal DCO_CTL is not based on a difference between the reference clock CLK_REF and the clock feedback CLK_FB from the divider circuit 114. Instead, the DLF 121 controls the DCO circuit 112 to oscillate at a constant calibration frequency $F_{OUT}$ in response to the calibration enable signal CAL_EN being in the second state. Rather than the calibration enable signal CAL_EN, a reset signal to the DLF 121 or another signal method can be used to put the DLF 121 in the calibration mode. In the normal operation mode, the DLF 121 and the clock divider 114 are employed as described above to operate the PLL 102 in a closed-loop fashion.

Since an objective of the calibration circuit 104 is to adjust the resolution of the TDC circuit 106 to a desired nominal time resolution, the resolution indicator $TDC_{RES}$ is compared to a nominal resolution indicator $TDC_{NOM}$ that is preset according to an optimized loop bandwidth. This comparison can identify a difference between the resolution of the TDC circuit 106 and the desired nominal resolution. A circuit for providing the feedback signal SIG_FB and the reference signal SIG_REF is described in detail with reference to FIG. 4 below. The calibration time difference is calculated in this example as a fraction of the output clock frequency $F_{OUT}$ when the DCO circuit 112 is controlled to oscillate at the calibration frequency. Other methods of generating a fixed time difference between the reference signal SIG_REF and the feedback signal SIG_FB during calibration mode may be employed.

To make the comparison between the resolution indicator $TDC_{RES}$ and the nominal resolution indicator $TDC_{NOM}$, the calibration circuit 104 includes a resolution control circuit 126, which includes a comparator 128. The comparator 128 compares the resolution indicator $TDC_{RES}$ and the nominal resolution indicator $TDC_{NOM}$ to produce a comparison result COMP. The resolution control circuit 126 generates the resolution control signal RES_TDC and stores the resolution control signal RES_TDC in an accumulator 130. The accumulator 130 adjusts the resolution control signal RES_TDC based on the comparison result COMP of the comparator 128 in the calibration mode and stores the resolution control signal RES_TDC during the operation mode. In the calibration mode, the accumulator 130 incrementally increases the resolution control signal RES_TDC (e.g., in each cycle of the reference signal SIG_REF) in response to the comparison result COMP indicating the resolution indicator $TDC_{PE}s$ is less than the nominal resolution indicator $TDC_{NOM}$ and incrementally decreases the resolution control signal RES_TDC in response to the comparison result COMP indicating the resolution indicator $TDC_{PE}s$ is more than the nominal resolution indicator $TDC_{NOM}$. The resolution control signal RES_TDC provided to the TDC circuit 106 causes the TDC resolution to change and the digital control value DTL_CTL to change accordingly (DTL_CTL=1/$F_{OUT}$/$TDC_{RES}$).

For example, if the calibration mode is entered upon power on, a default resolution control value RES_TDC is stored in the accumulator 130. During several cycles of the reference signal SIG_REF in the calibration mode, a comparison result COMP may be generated each cycle, and the resolution control signal RES_TDC is gradually modified based on the comparison result COMP. For example, the accumulator 130 may employ a least means squared (LMS) algorithm in this process. As the resolution control signal RES_TDC changes, TDC circuit 106 adjusts the resolution indicator $TDC_{PE}s$ to be closer to the nominal resolution indication $TDC_{NOM}$. Eventually, the comparison result COMP indicates that the resolution indicator $TDC_{PE}s$ and the nominal resolution indicator $TDC_{NOM}$ are matching, and the resolution control signal RES_TDC stabilizes (i.e., stops changing) in the accumulator 130, which indicates that the TDC circuit 106 is generating the digital control value DTL_CTL at the desired nominal resolution corresponding to the nominal resolution indicator $TDC_{NOM}$. Employing the calibration circuit 104, each of the TDC circuits 106 in each of the PLLs 102 in an IC 110 can be normalized to a same gain, which contributes to a consistent jitter response in different clock domains of the IC 110.

Figure 2:
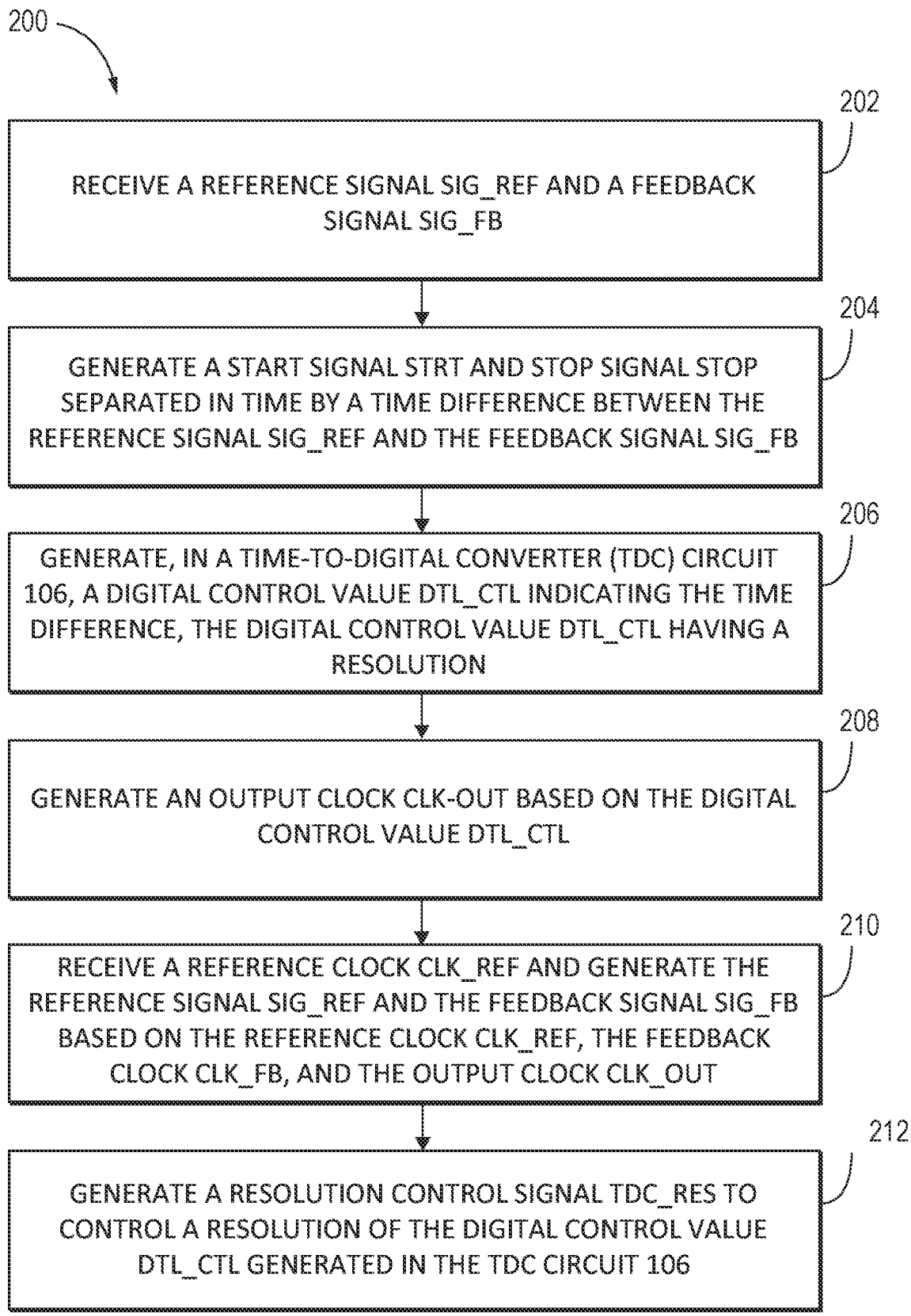
FIG. 2 is a flow chart of a method in the calibrated PLL in FIG. 1.

FIG. 2 is a flowchart illustrating a method 200 in the calibrated PLL 100 in FIG. 1. The method includes receiving a reference signal SIG_REF and a feedback signal SIG_FB (block 202) and generating a start signal STRT and a stop signal STOP separated in time by a time difference between the reference signal SIG_REF and the feedback signal SIG_FB (block 204). The method includes generating, in a time-to-digital converter (TDC) circuit 106, a digital control value DTL_CTL indicating the time difference, the digital control value DTL_CTL having a resolution (block 206). The method further includes generating an output clock CLK_OUT based on the digital control value DTL_CTL (block 208). It should be noted that, in response to a calibration mode, the output clock CLK_OUT is based on a fixed DCO_CTL value generated in the DLF 121. The method also includes receiving a reference clock CLK_REF and generating the reference signal SIG_REF and the feedback signal SIG_FB based on the reference clock CLK_REF, the feedback clock CLK_FB, and the output clock CLK_OUT(block 210), and generating a resolution control signal $TDC_{RES}$ to control a resolution of the digital control value DTL_CTL generated in the TDC circuit 106 (block 212).

Figure 3:
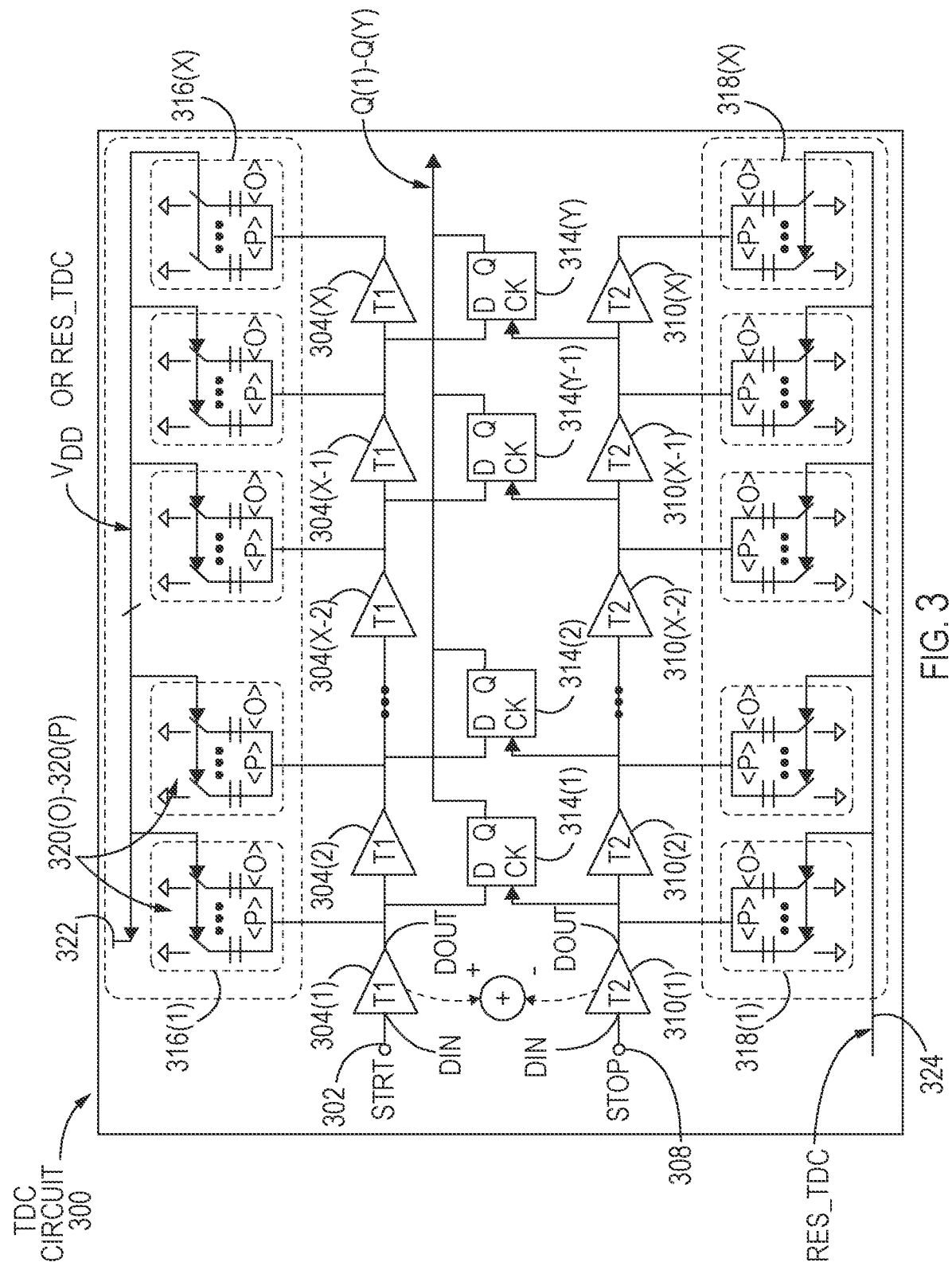
FIG. 3 is a schematic diagram of a TDC circuit based on a Vernier method for measuring a time difference between a start signal and a stop signal.

FIG. 3 is a schematic diagram of a TDC circuit 300, which may be one example of the TDC circuit 106, employing the Vernier method for generating a measurement of a time difference between a start signal STRT and a stop signal STOP in time increments. The start signal STRT is received at an input 302, which is an input of a first delay circuit 304(1) of first delay circuits 304(1)-304(X) coupled in series. Each of the first delay circuits 304(1)-304(X) has a first delay T1 (e.g., propagation delay) from an input DIN to an output DOUT. The stop signal STOP is received at an input 308, which is an input of a second delay circuit 310(1) of second delay circuits 310(1)-310(X) coupled in series. Each of the second delay circuits 310(1)-310(X) has a second delay T2 from an input DIN to an output DOUT. The TDC circuit 300 includes a plurality of flip-flop circuits 314(1)-(314(Y), each including a data input D coupled to an output Q of a corresponding one of the first delay circuits 304(1)-304(X). Each of the flip-flop circuits 314(1)-314(Y) includes a clock input CK coupled to an output DOUT of a corresponding one of the second delay circuits 310(1)-310(Y). Each of the outputs DOUT of the first delay circuits 304(1)-304(X) is coupled to a corresponding one of first adjustable capacitors 316(1)-316(X). Each of the outputs DOUT of the second delay circuits 310(1)-310(X) is coupled to a corresponding one of second adjustable capacitors 318(1)-318(X). In some examples, the first adjustable capacitors 316(1)-316(X) and the second adjustable capacitors 318(1)-318(X) may be banks of capacitors 320(0)-320(P) coupled in parallel, such that adjusting a capacitance may include activating more or fewer of the capacitors in a bank.

Although not shown in detail in FIG. 3, it should be understood by persons of ordinary skill in the art that the start signal STRT propagates through the series of first delay circuits 304(1)-304(X) and the stop signal STOP propagates through the series of second delay circuits 310(1)-310(X), and outputs Q(1)-Q(Y) of the flip-flop circuits 314(1)-314(Y) can be used to resolve a time difference between the start signal STRT and the stop signal STOP. The first delay T1 is longer than the second delay T2. Thus, a time difference between the start signal STRT and the stop signal STOP is resolved as a multiple of a delay difference between the first delay T1 and the second delay T2 (i.e., T1-T2). Therefore, the resolution or time increments of the TDC circuit 300 are equal to the delay difference T1-T2, and the delay difference T1-T2 can be adjusted by adjusting the first delay T1 and/or the second delay T2. A change to the first adjustable capacitors 316(1)-316(X) modifies the first delay T1, and a change to the second adjustable capacitors 318(1)-318(X) modifies the second delay T2. In this manner, the resolution control signal RES_TDC in FIG. 1, provided from the resolution control circuit 126 to the TDC circuit 106, may be used to adjust the resolution (i.e., gain) of the TDC circuit 106 to a desired nominal resolution, which may include controlling a number of capacitors in each bank of the first adjustable capacitors 316(1)-316(X) and the second adjustable capacitors 318(1)-318(X). Employing this technique, the TDC circuits 106 in all the calibrated PLLs 100 in an IC 110 can be calibrated to a same resolution (with an ignorable error, e.g., <1%).

In one example, the first adjustable capacitors 316(1)-316(X) are all coupled to a first control input 322, which may be coupled to a power rail (not shown) that provides a supply voltage VDD, such that a capacitance of each of the first adjustable capacitors 316(1)-316(X) is fixed and maximized. In this example, the first adjustable capacitors 316(1)-316(X) may alternatively be fixed capacitors, which are not adjustable. Each of the second adjustable capacitors 318(1)-318(X) is coupled to a second control input 324, which receives the resolution control signal RES_TDC. In this example, the resolution control signal RES_TDC is a digital value identifying a number of capacitors in a bank that are activated. In this regard, the second delay T2 may be changed relative to the first delay T1.

In a second example, capacitances of each of the first adjustable capacitors 316(1)-316(X) and the second adjustable capacitors 318(1)-318(X) are controlled by the resolution control signal RES_TDC, which may contain up to P bits for controlling the respective capacitors 320(0_320(P). Thus, changes to both the first delay T1 and the second delay T2 may be employed to adjust the delay difference T1-T2.

FIG. 4A is a schematic diagram of a phase generator circuit ("phase generator") 400, which may be the phase generator 116 in the resolution circuit 104 in FIG. 1 employed for calibrating the TDC circuit 106 in the calibrated PLL 100. The phase generator 400 is one non-limiting example of a circuit for providing the feedback signal SIG_FB and the reference signal SIG_REF with the calibration time difference and calibration frequency described above. The phase generator 400 includes a calibration signal generator 402, including flip-flops 404(1)-404(4), each with a data input D, a clock input CK, and an output QB. It should be noted that the outputs QB are complement outputs, which take a complementary state (e.g., inverse) of the data input D in response to clock input CK. Signals 406(1)-406(4) are the values of the outputs QB of the flip-flops 404(1)-404(4). The clock inputs CK of flip-flops 404(1) and 404(2) are triggered by a rising edge of the output clock CLK_OUT. The signal 406(1) from flip-flop 404(1) is provided to the data input D of the flip-flop 404(1), causing the signal 406(1) to alternate in the state (i.e., between a binary "0" and binary "1") in response to rising edges of the output clock CLK_OUT. The signal 406(1) is inverted by inverter 408 and provided in the inverse form to the data input D of the flip-flop 404(2), which also alternates each cycle. Since the flip-flops 404(1) and 404(2) receive true and complement copies of the signal 406(1), the signals 406(1) and 406(2) of the flip-flops 404(1) and 404(2) have opposite states. The data inputs D of the flip-flops 404(3) and 404(4) receive the signals 406(3) and 406(4), respectively, so the signals 406(3) and 406(4) also alternate between binary states each time the flip-flops 404(3) and 404(4) are triggered. The flip-flop 404(3) is triggered by the signal 406(1) and the flip-flop 404(4) is triggered by the signal 406(2). The phase generator 400 also includes multiplexors 410 and 412. The multiplexors 410 and 412 are controlled by the calibration enable CAL_EN, which indicates the operation mode in a first state and the calibration mode in a second state. In the operation mode, the multiplexors 410 and 412 select the reference clock CLK_REF as the reference signal SIG_REF and select the feedback clock CLK_FB as the feedback signal SIG_FB. In calibration mode, the multiplexor 410 selects the signal 406(3) as the reference signal SIG_REF and the signal 406(4) as the feedback signal SIG_FB.

FIG. 4B is a timing diagram illustrating the states of the output clock CLK_OUT, the signals 406(1)-406(4), the reference signal SIG_REF, and the feedback signal SIG_FB during the calibration mode. Description of the timing diagram in FIG. 4B also refers to FIG. 4A. As shown, the phase generator 400 produces the reference signal SIG_REF and the feedback signal SIG_FB having a time difference that depends on the output clock frequency $F_{OUT}$ in the calibration mode. The output clock CLK_OUT oscillates at the frequency $F_{OUT}$, Corresponding to a cycle period of $1/F_{OUT}$. As shown, the flip-flops 404(1) and 404(2) are triggered at each rising edge of the output clock CLK_OUT in this example and therefore oscillate at a frequency that is one-half (½) the frequency $F_{OUT}$. The flip-flops 404(3) and 404(4) are trigged at the rising edges of signals 406(1) and 406(2), respectively. Therefore, signals 406(3) and 406(4) have opposite states and oscillate at a frequency that is one-quarter (¼) of the frequency $F_{OUT}$. In the calibration mode, as shown in FIG. 4B, the reference signal SIG_REF is based on the signals 406(3), and the feedback signal SIG_FB is based on the signals 406(4). As shown in FIG. 4B, the time difference between the reference signal SIG_REF and the feedback signal SIG_FB is equal to the period $1/F_{OUT}$ of the output clock CLK_OUT. In this regard, the phase generator 400 provides a calibration time difference ($1/F_{OUT}$) at a calibration frequency $F_{OUT}$ for calibration of the TDC circuit 106, as described above with reference to FIG. 1.

FIG. 5 is a block diagram of an exemplary processor-based system 500 that includes a processor 502 (e.g., a microprocessor), including an instruction processing circuit 504. The processor-based system 500 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 500 includes the processor 502. The processor 502 represents one or more general-purpose processing circuits, such as a microprocessor, central processing unit, or the like. More particularly, the processor 502 may be an EDGE instruction set microprocessor or other processor implementing an instruction set that supports explicit consumer naming for communicating produced values resulting from execution of producer instructions. The processor 502 is configured to execute processing logic in instructions for performing the operations and steps discussed herein. In this example, the processor 502 includes an instruction cache 506 for temporary, fast access memory storage of instructions accessible by the instruction processing circuit 504. Fetched or prefetched instructions from a memory, such as a main memory 508, over a system bus 510, are stored in the instruction cache 506. Data may be stored in a cache memory 512 coupled to the system bus 510 for low-latency access by the processor 502. The instruction processing circuit 504 is configured to process instructions fetched into the instruction cache 506 and process the instructions for execution.

The processor 502 and the main memory 508 are coupled to the system bus 510 and can intercouple peripheral devices included in the processor-based system 500. As is well known, the processor 502 communicates with these other devices by exchanging address, control, and data information over the system bus 510. For example, the processor 502 can communicate bus transaction requests to a memory controller 514 in the main memory 508 as an example of a slave device. Although not illustrated in FIG. 5, multiple system buses 510 could be provided; wherein each system bus 510 constitutes a different fabric. In this example, the memory controller 514 is configured to provide memory access requests to a memory array 516 in the main memory 508. The memory array 516 is comprised of an array of storage bit cells for storing data. The main memory 508 may be a read-only memory (ROM), flash memory, dynamic random-access memory (DRAM), such as synchronous DRAM (SDRAM), etc. and/or static memory (e.g., flash memory, SRAM, etc.), as non-limiting examples.

Other devices can be connected to the system bus 510. As illustrated in FIG. 5, these devices can include the main memory 508, one or more input device(s) 518, one or more output device(s) 520, a modem 522, and one or more display controllers 524, as examples. The input device(s) 518 can include any type of input device, including but not limited to input keys, switches, voice processors, etc. The output device(s) 520 can include any type of output device, including but not limited to audio, video, other visual indicators, etc. The modem 522 can be any device configured to allow an exchange of data to and from a network 526. The network 526 can be any type of network, including but not limited to a wired or wireless network, a private or public network, a local area network (LAN), a wireless local area network (WLAN), a wide area network (WAN), a BLUETOOTH™ network, and the Internet. The modem 522 can be configured to support any type of communications protocol desired. The processor 502 may also be configured to access the display controller(s) 524 over the system bus 510 to control information sent to one or more displays 528. The display(s) 528 can include any type of display, including but not limited to a cathode ray tube (CRT), a liquid crystal display (LCD), a plasma display, etc.

The processor-based system 500 in FIG. 5 may include a set of instructions 530 to be executed by the processor 502 for any application desired according to the instructions. The instructions 530 may be stored in the main memory 508, processor 502, and/or instruction cache 506 as examples of a non-transitory computer-readable medium 532. The instructions 530 may also reside, completely or at least partially, within the main memory 508 and/or within the processor 502 during their execution. The instructions 530 may further be transmitted or received over the network 526 via the modem 522, such that the network 526 includes computer-readable medium 532.

Any of the circuits in the processor-based system 500, and in particular the modem 522 and the output devices 520, may include multiple clock domains, each including a calibrated PLL that includes a calibration circuit to calibrate a TDC to a nominal resolution for a nominal gain, to normalize jitter response across the IC, as illustrated in FIGS. 1, 3, 4A, and 4B.

While the computer-readable medium 532 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or a computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields, or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A calibrated phase-locked loop (PLL), comprising:
a PLL comprising:
a phase-frequency detector (PFD) circuit configured to:
receive a reference signal and a feedback signal; and
generate a start signal and a stop signal separated in time by a time difference between the reference signal and the feedback signal;
a time-to-digital converter (TDC) circuit configured to generate a digital control value indicating the time difference, the digital control value having a resolution;
a digitally controlled oscillator (DCO) circuit configured to generate an output clock based on the digital control value; and
a divider circuit configured to:
generate a feedback clock based on the output clock;
a calibration circuit configured to:
receive a reference clock;
generate the reference signal and the feedback signal based on the reference clock, the feedback clock, and the output clock; and
generate a resolution control signal to control a resolution of the TDC circuit.

2. The calibrated PLL of claim 1, the calibration circuit comprising:
a multiplier circuit configured to generate a resolution indicator as a product of the digital control value and a frequency of the output clock; and
a resolution control circuit comprising a comparator configured to compare the resolution indicator and a nominal resolution indicator,
wherein the calibration circuit configured to generate the resolution control signal further comprises the resolution control circuit configured to adjust the resolution control signal based on a comparison result of the comparator.

3. The calibrated PLL of claim 2, the resolution control circuit comprising an accumulator circuit configured to:
store the resolution control signal; and
incrementally increase the resolution control signal in response to the comparison result indicating the resolution indicator is less than the nominal resolution indicator; and
incrementally decrease the resolution control signal in response to the comparison result indicating the resolution indicator is more than the nominal resolution indicator.

4. The calibrated PLL of claim 3, the accumulator circuit comprising a least means squared (LMS) algorithm circuit.

5. The calibrated PLL of claim 1, the calibration circuit further comprising a frequency counter circuit configured to:
receive the output clock;
receive the reference clock; and
determine the frequency of the output clock based on the frequency of the reference clock.

6. The calibrated PLL of claim 1, the calibration circuit further configured to:
receive a calibration enable signal;
in response to an operation mode in which the calibration enable signal comprises a first state:
generate the reference signal having a reference frequency of the reference clock; and
generate the feedback signal having a feedback frequency based on an output frequency of the output clock; and
in response to a calibration mode in which the calibration enable signal comprises a second state:
generate the reference signal and the feedback signal, each having a calibration frequency and a calibration time difference.

7. The calibrated PLL of claim 6, the calibration circuit comprising:
a phase generator comprising a state machine configured to, in the calibration mode:
generate the reference signal and the feedback signal, each having the calibration frequency of one quarter (¼) of the output frequency; and
generate the feedback signal delayed by the calibration time difference equal to one quarter (¼) of a one cycle period at the calibration frequency.

8. The calibrated PLL of claim 1, the TDC circuit further configured to:
receive the start signal and the stop signal;
generate the digital control value as a number of time increments in the time difference between the start signal and the stop signal, wherein the resolution of the digital control value generated in the TDC circuit corresponds to one of the time increments.

9. The calibrated PLL of claim 8, the TDC circuit comprising:
first delay circuits coupled in a first series, wherein an output of one of the first delay circuits in the first series is coupled to an input of a next one of the first delay circuits in the first series;
first capacitors, each coupled to the output of one of the first delay circuits in the first series;
second delay circuits coupled in a second series, wherein an output of one of the second delay circuits in the second series is coupled to an input of a next one of the second delay circuits in the second series; and
second adjustable capacitors, each coupled to the output of one of the second delay circuits in the second series, wherein:
each of the first delay circuits comprises a first delay based on a first capacitance of the first capacitor coupled to the output of the first delay circuit;
each of the second delay circuits comprises a second delay based on a second capacitance of the second adjustable capacitor coupled to the output of the second delay circuit;
each time increment of the time increments corresponds to a difference between the first delay of each of the first delay circuits and the second delay of each of the second delay circuits; and
the TDC circuit is configured to control the time increment based on the resolution control signal.

10. The calibrated PLL of claim 9, wherein:
the TDC circuit configured to control the time increment comprises the TDC circuit configured to adjust the second capacitance of each of the second adjustable capacitors; and
the first capacitors comprise a fixed capacitance.

11. The calibrated PLL of claim 9, wherein:
the first capacitors comprise first adjustable capacitors; and
the TDC circuit configured to control the time increment comprises the TDC circuit configured to adjust the first capacitance of each of the first adjustable capacitors and adjust the second capacitance of each of the second adjustable capacitors.

12. A method of operating a calibrated digital phase-locked loop (PLL), comprising:
receiving a reference signal and a feedback signal;
generating a start signal and a stop signal separated in time by a time difference between the reference signal and the feedback signal;
generating, in a time-to-digital converter (TDC) circuit, a digital control value indicating the time difference, the digital control value having a resolution;
generating an output clock based on the digital control value;
generating a feedback clock based on the output clock;
receiving a reference clock and generating the reference signal and the feedback signal based on the reference clock, the feedback clock, and the output clock; and
generating a resolution control signal to control a resolution of the digital control value generated in the TDC circuit.

13. The method of claim 12, the calibration circuit comprising:
generating a resolution indicator as a product of the digital control value and a frequency of the output clock; and
comparing the resolution indicator and a nominal resolution indicator,
wherein generating the resolution control signal further comprises adjusting the resolution control signal based on a comparison result of the comparing.

14. The method of claim 13, further comprising:
storing the resolution control signal; and
incrementally increasing the resolution control signal in response to the comparison result indicating the resolution indicator is less than the nominal resolution indicator; and
incrementally decreasing the resolution control signal in response to the comparison result indicating the resolution indicator is more than the nominal resolution indicator.

15. The method of claim 14, wherein incrementally increasing and incrementally decreasing the resolution control signal comprises employing a least means squared (LMS) algorithm.

16. The method of claim 13, further comprising:
receiving the reference clock; and
determining the frequency of the output clock based on the frequency of the reference clock.

17. The method of claim 12, further comprising:
receiving a calibration enable signal;
in response to an operation mode in which the calibration enable signal comprises a first state:
generating the reference signal having a reference frequency of the reference clock; and
generating the feedback signal having a feedback frequency based on an output frequency of the output clock; and
in response to a calibration mode in which the calibration enable signal comprises a second state:
generating the reference signal and the feedback signal, each having a calibration frequency and a calibration time difference.

18. The method of claim 17, further comprising:
generating, by a state machine:
the reference signal and the feedback signal, each having the calibration frequency of one quarter (¼) of the output frequency; and
the feedback signal delayed by the calibration time difference equal to one quarter (¼) of a one cycle period at the calibration frequency.

19. The method of claim 12, further comprising:
receiving the start signal and the stop signal;
generating the digital control value to indicate a number of time increments in the time difference between the start signal and the stop signal,
wherein the resolution of the digital control value generated in the TDC circuit corresponds to one of the time increments.

20. The method of claim 19, further comprising:
providing the start signal to a first series of first delay circuits, wherein:
an output of one of the first delay circuits in the first series is coupled to an input of a next one of the first delay circuits in the first series; and
the output of each of the first delay circuits in the first series is coupled to one of a plurality of first capacitors;
providing the stop signal to a second series of second delay circuits, wherein:
an output of one of the second delay circuits in the second series is coupled to an input of a next one of the second delay circuits in the second series; and
the output of each of the second delay circuits in the second series is coupled to one of a plurality of second adjustable capacitors;

wherein:
each of the first delay circuits comprises a first delay based on a first capacitance of the first capacitor coupled to the output of the first delay circuit;
each of the second delay circuits comprises a second delay based on a second capacitance of the second adjustable capacitor coupled to the output of the second delay circuit;
each time increment of the time increments corresponds to a difference between the first delay of each of the first delay circuits and the second delay of each of the second delay circuits; and
the time increment is adjusted according to the resolution control signal.

21. The method of claim 20, further comprising:
adjusting the time increment comprises adjusting the second capacitance of each of the second adjustable capacitors according to the resolution control signal.

22. The method of claim 20, wherein:
the first capacitors comprise first adjustable capacitors; and
adjusting the time increment comprises adjusting the second capacitance of each of the second adjustable capacitors and adjusting the first capacitance of each of the first adjustable capacitors according to the resolution control signal.

23. An integrated circuit, comprising:
digital logic circuits comprising a plurality of clock domains, each clock domain comprising a calibrated phase-locked loop (PLL), comprising:
a PLL comprising:
a phase-frequency detector (PFD) circuit configured to:
receive a reference signal and a feedback signal; and
generate a start signal and a stop signal separated in time by a time difference between the reference signal and the feedback signal;
a time-to-digital converter (TDC) circuit configured to generate a digital control value indicating the time difference, the digital control value having a resolution;
a digitally controlled oscillator (DCO) circuit configured to generate an output clock based on the digital control value; and
a divider circuit configured to:
generate a feedback clock based on the output clock;
a calibration circuit configured to:
receive the output clock, the feedback clock, and a reference clock;
generate the reference signal and the feedback signal; and
generate a resolution control signal to control a resolution of the digital control value generated in the TDC circuit.

* * * * *